(12) United States Patent
Berry et al.

(10) Patent No.: US 9,532,472 B2
(45) Date of Patent: Dec. 27, 2016

(54) SECURING ACCESS TO ONE OR MORE ELEMENTS OF A DEVICE

(71) Applicant: DELL PRODUCTS, L.P., Round Rock, TX (US)

(72) Inventors: Andrew B. Berry, Austin, TX (US); Orin M. Ozias, Austin, TX (US); John Charles Donachy, Austin, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 437 days.

(21) Appl. No.: 14/254,779

(22) Filed: Apr. 16, 2014

(65) Prior Publication Data

US 2015/0305182 A1 Oct. 22, 2015

(51) Int. Cl.
*G06F 1/16* (2006.01)
*H05K 5/02* (2006.01)

(52) U.S. Cl.
CPC .................. *H05K 5/0221* (2013.01)

(58) Field of Classification Search
CPC ........ H05K 7/1425; H05K 5/00; G06F 1/1613
USPC . 455/456.2, 456.3, 435.1, 411, 414.1, 432.1, 455/420; 70/283; 340/568.1; 361/690, 361/728, 725, 699, 679.33, 679.26, 361/679.09, 679.55, 679.57, 679.14, 361/679.01
See application file for complete search history.

(56) References Cited

U.S. PATENT DOCUMENTS

| 9,127,431 | B2* | 9/2015 | Lanham | E05F 15/60 |
| 2004/0107751 | A1* | 6/2004 | Hyatt, Jr. | E05B 47/063 70/283 |
| 2014/0326744 | A1* | 11/2014 | Ratnakar | A61J 7/02 221/1 |
| 2015/0287299 | A1* | 10/2015 | Eckert | G08B 13/1418 340/568.2 |

OTHER PUBLICATIONS

Dell, Kensington Manufacturer Part#: K67718US USB Port Lock with Blockers, Dell Part#: A7764950, printed from http://accessories.us.dell.com/sna/productdetail.aspx?c=us&l=en&s=bsd&cs=111&sku=a7764950 (1pg).

* cited by examiner

*Primary Examiner* — Hung Duong
(74) *Attorney, Agent, or Firm* — North Weber & Baugh LLP

(57) ABSTRACT

Aspects of the present invention include systems and methods include unique solutions for providing secure, selectable access to one or more functional elements of a device. In embodiments, a tab-lock system with moveable tab-locks can be positioned to block or allow access to functional elements of a device. In embodiments, the tab-lock system is configured so that when a locking device, such as a common Kensington lock, is locked to the device, the tab-locks settings cannot be changed. Such systems may be used to control the ability of individuals to physically access the interfaces of the device. Thus, such systems help secure an electronic device against inadvertent or malicious actions.

20 Claims, 9 Drawing Sheets

900

```
┌─────────────────────────────────────────────┐
│ Assemble a device comprising one or more    │
│ functional elements, and each functional    │─ 905
│ element has an opening for accessing the    │
│ functional element outside the device       │
└─────────────────────────────────────────────┘
                      │
                      ▼
┌─────────────────────────────────────────────┐
│ Include with the device a tab-lock system   │
│ that provides selectable access to the      │─ 910
│ openings for a set of the one or more       │
│ functional elements                         │
└─────────────────────────────────────────────┘
```

FIGURE 9

SECURING ACCESS TO ONE OR MORE ELEMENTS OF A DEVICE

BACKGROUND

Field of Invention

The present invention relates generally to electronic devices, and relates more particularly to having the ability to secure access to one or more functional elements of an electronic device.

Description of the Related Art

Electronic devices—such as, by way of example and not limitation, networking devices—have become increasing more commonplace. Such devices are located in various locations. These locations often have varied levels of security. In some instances, the location of a device is very secure. For example, a device in a server room or data center typically has good security with restricted access to authorized personnel only. In such instances, it is very difficult for a third-party to gain physical access to the device.

However, some devices are in locations that are less secure. For example, for small businesses, their networking equipment may be in open areas or less secure areas making it accessible to third parties. Or, some rack areas may be shared with multiple parties or multiple vendors. Since the space is shared, a device may be subjected to a third-party's attempt to access or alter a device. For example, person may try to access a computer system via a USB interface.

Accordingly, what is needed are systems and methods that can provide varied levels of access to functional elements of a device or devices.

BRIEF DESCRIPTION OF THE DRAWINGS

Reference will be made to embodiments of the invention, examples of which may be illustrated in the accompanying figures, in which like parts may be referred to by like or similar numerals. These figures are intended to be illustrative, not limiting. Although the invention is generally described in the context of these embodiments, it should be understood that it is not intended to limit the spirit and scope of the invention to these particular embodiments. These drawings shall in no way limit any changes in form and detail that may be made to the invention by one skilled in the art without departing from the spirit and scope of the invention.

FIG. 9 depicts a method for making a device with a cover/tab-lock system according to embodiments of the present invention.

DESCRIPTION OF THE PREFERRED EMBODIMENTS

Figure 1:
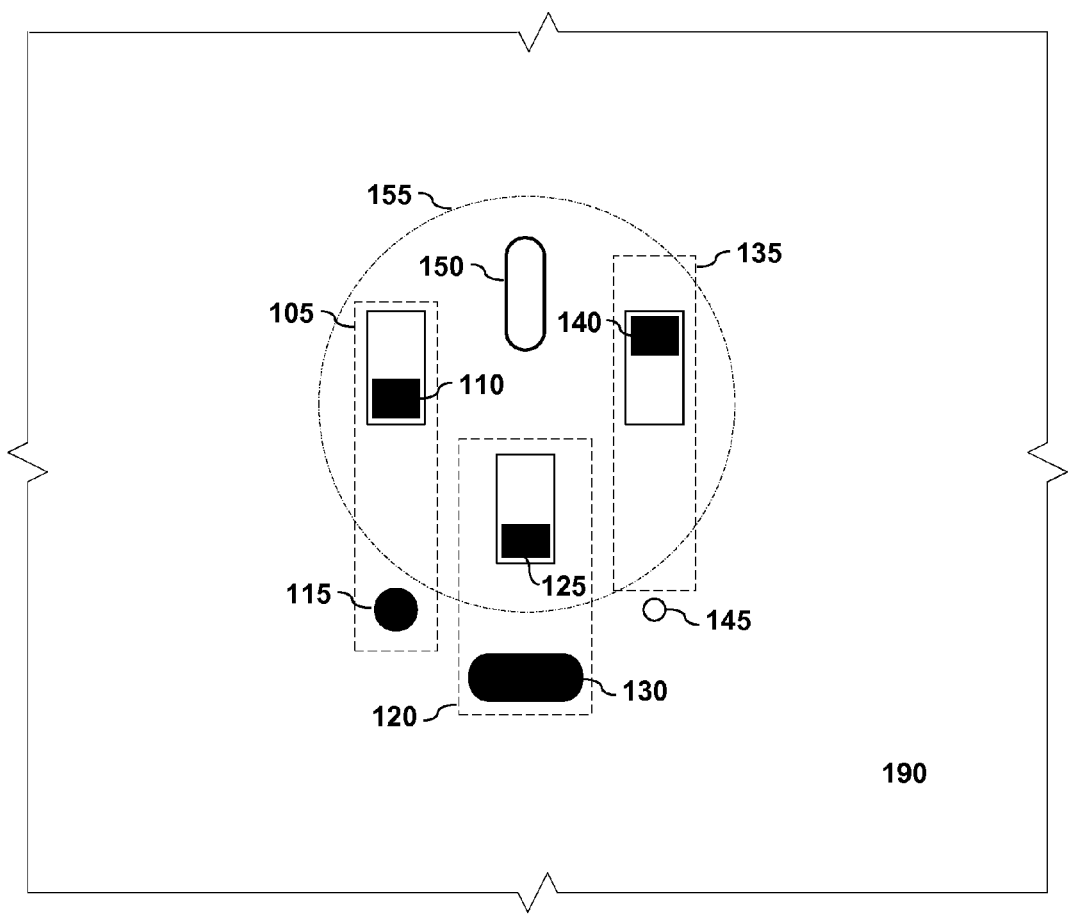
FIG. 1 depicts a partial front view with hidden lines of a device enclosure with a cover system/tab-lock system according to embodiments of the present invention.

In the following description, for purposes of explanation, specific examples and details are set forth in order to provide an understanding of the invention. It will be apparent, however, to one skilled in the art that the invention may be practiced without these details. Well-known process steps may not be described in detail in order to avoid unnecessarily obscuring the present invention.

Other applications are possible, such that the following examples should not be taken as limiting. Furthermore, one skilled in the art will recognize that aspects of the present invention, described herein, may be implemented in a variety of ways.

Components, or modules, shown in the diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components or modules.

Furthermore, connections between components within the figures are not intended to be limited to direct connections. Also, additional or fewer connections may be used.

In the detailed description provided herein, references are made to the accompanying figures, which form a part of the description and in which are shown, by way of illustration, specific embodiments of the present invention. Although these embodiments are described in sufficient detail to enable one skilled in the art to practice the invention, it shall be understood that these examples are not limiting, such that other embodiments may be used, and changes may be made without departing from the spirit and scope of the invention.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, such phrases in various places in the specification are not necessarily all referring to the same embodiment or embodiments.

It shall be noted that the use of the terms "set" and "group" in this patent document shall include any number of elements. Furthermore, it shall be noted that method steps may not be limited to the specific order set forth herein; rather, one skilled in the art shall recognize, in some embodiments, that more or fewer steps may be performed, that certain steps may optionally be performed, and that steps may be performed in different orders, including being done some steps being done concurrently.

It should be noted that, for purposes of explanation, the present invention is explained in the context of network systems and devices. It should be noted that these examples are provided for purposes of illustration and shall not be used to limit the present invention. Accordingly, the invention elements may be applied or adapted for use with other devices or in other contexts.

As noted above, there is a need for devices, such as (by way of example and not limitation) network switches, that are equipped to provide various levels of security when deployed in a non-controlled environment with multiple individuals having physical access to the device. Such devices typically have several interface accesses or openings that need to be protected and sometimes with different levels of security.

Accordingly, aspects of the present invention include unique approaches at providing hardware-based mechanisms to control software access and physical access to various interfaces on an electronic device. Thus, a customer can protect his or her data and investment by using selectable tab covers that block access to functional elements of the device. Due to a need to granularly select each interface for allowing or blocking access according to the security or options that the customer wants to give others, embodiments of the present invention providing gate mechanisms to allow for each moveable gate, cover, or tab to be selected that actually blocks an interface opening. Then, in embodiments, these tab options may be securely locked into place when a lockable device, such as a Kensington lock from Kensington of Redwood City, Calif., is inserted in an opening.

Turning to FIG. 1, depicted is a partial front view with hidden lines of a device enclosure 190 with a cover system or tab-lock system according to embodiments of the present invention. As shown in FIG. 1, part of an enclosure 190 of a device is shown. The enclosure 190 includes a plurality of openings. These openings 115, 130, and 145 provide access to functional elements or interfaces of the devices. For example, the openings may provide access to interfaces or functional elements such as (by way of example and not limitation) USB ports, serial port, console port, power button, reset button, etc. FIG. 1 also depicts a set of access covers or security covers 105, 120, and 135. These security covers may be moved into and out of position via a switch or finger-tab 110, 125, and 140 (respectively). For example, the switch 110 has been moved into a position such that the cover 105 extends to cover the opening 115 to the function element that is normally accessible via the opening 115. Similarly, the switch 125 has been moved into a position such that the cover 120 extends to cover the opening 130 to the function element, which may be, by way of example, a USB port. Note, however, that the switch 140 has been moved into a position such that its cover 135 does not cover the opening 145 to the function element—thereby making that functional element accessible via the opening 145.

Blocking access to a serial port/console port is beneficial because it essentially locks attempts to access the command line interface and thus stops malicious attempts to contaminate the local Ethernet network. This security is very important since multiple network elements may reside and function off this network, i.e. cash registers, gas pumps, phones, etc. Blocking access to a reset button stops unwarranted reloads or reboots. And, blocking access to a managed mode button stops people from having the ability to change this switch to a managed/unmanaged switch and therefore ensures that the initial switch settings stay unchanged. Customer can also block access to a USB port (e.g., a mini-USB key) so that no one else can insert a USB data device and try to download configurations or new images to the device.

It shall be noted that the depicted embodiment allows for access to each function element to be separately selected.

Figure 2:
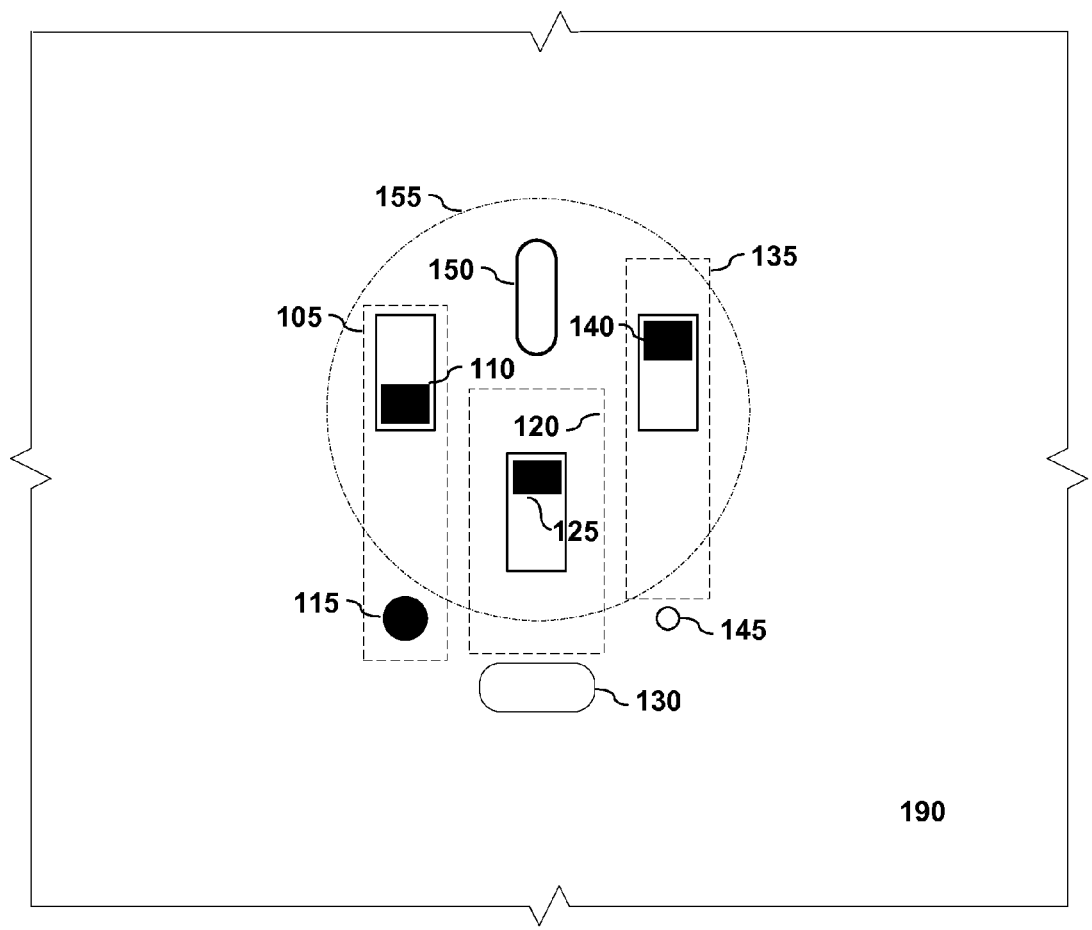
FIG. 2 depicts the cover system/tab-lock system of FIG. 1 in which one of the tab-locks or access covers has been moved according to embodiments of the present invention.

For example, FIG. 2 depicts the cover system or tab-lock system of FIG. 1 in which one of the tab-lock or access covers, cover 120 has been moved according to embodiments of the present invention to allow access to interface 130. In alternative embodiments, one or more of the covers may be coupled such that selecting of one cover affects the opening or blocking of access to another functional element or elements. For example, if one switch is selected, another switch may be linked to have the same or opposite configuration as the first switch.

Returning to FIG. 1, also depicted is a lock mounting feature 150 comprising an opening configured such that when a locking device is mounted and locked to the enclosure 190, the tab-lock or covers 105, 120, and 135 are prohibited from having their positions changed. In embodiments, the locking device may be a cover or a cable lock, such as a Kensington lock.

Figure 3:
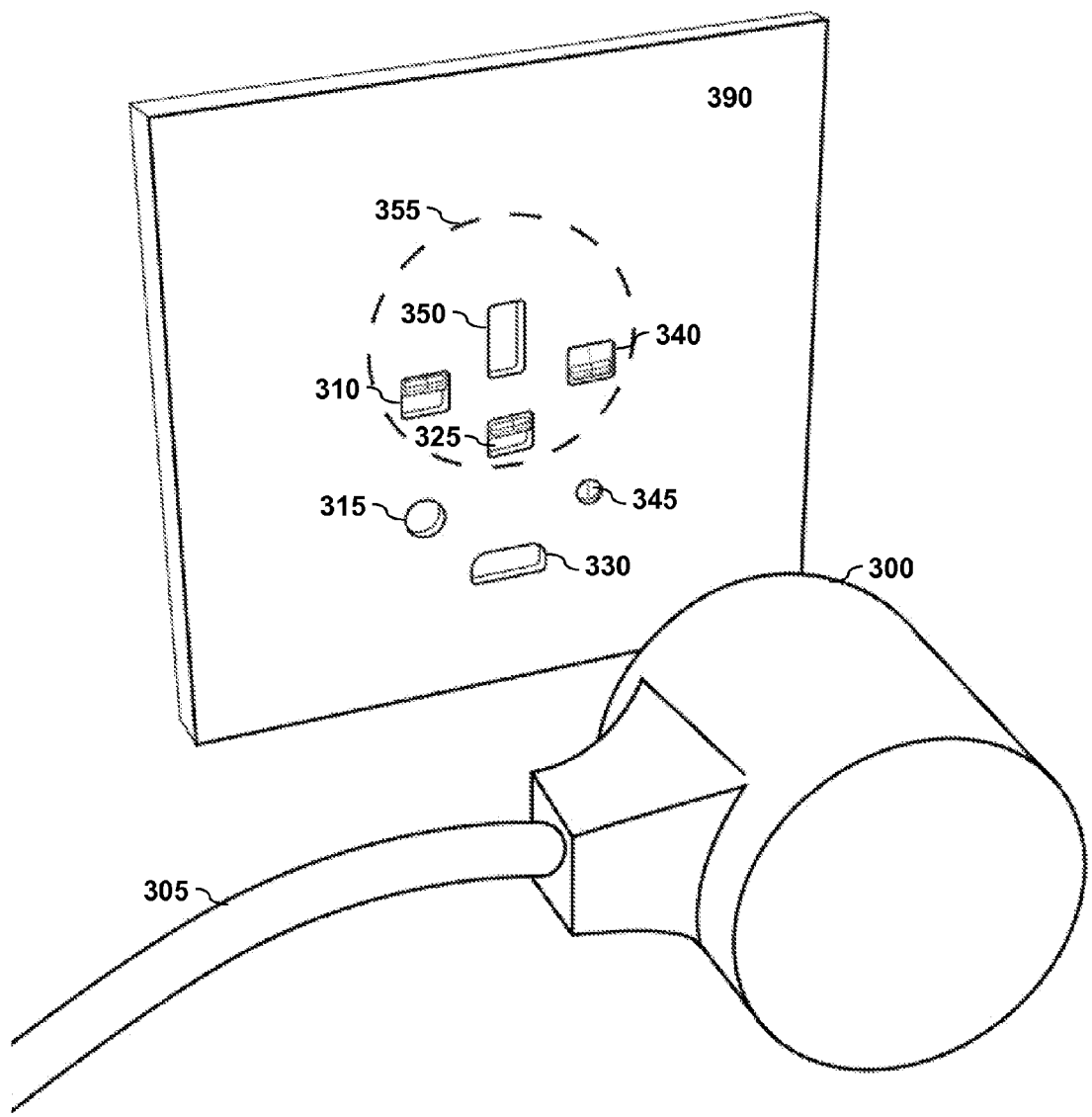
FIG. 3 depicts a partial front view of a device enclosure with a cover system/tab-lock system and a locking device according to embodiments of the present invention.

FIG. 3 depicts a partial front view of a device enclosure 390 with a cover system or tab-lock system and a locking device 300 according to embodiments of the present invention. In the depicted example of a locking device or cover 300, the locking device 300 may include a cable 305 to secure the device to a structural element to make it more difficult for someone to try to remove the device.

After the desired access levels to the functional elements has been selected (by moving the switches to the desired positions to allow or block access the openings to the functional elements or interfaces), a locking device (e.g., locking device 300 in FIG. 3) is locked into place to securely cover an area (e.g., area 355) that blocks access to the switches 310, 325, and 340 so that they cannot be moved to a different position. Thus, a customer may configure his/her switch and then use this built-in tab-lock/cover system to fully secure his/her settings so that unwanted access and changes cannot occur. It should be noted that this may also deter curious people who may attempt to access to these devices.

Additionally or alternatively, in embodiments, the locking device may be configured such that it mechanically prohibits the access covers from being able to be moved.

Figure 4:
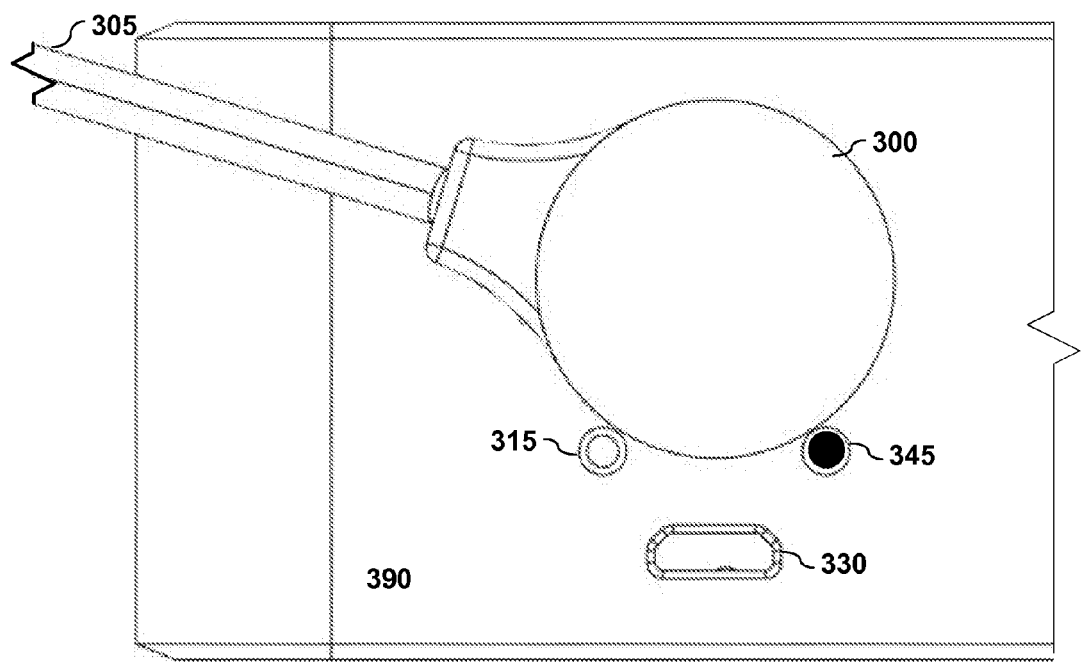
FIG. 4 depicts the cover system/tab-lock system of FIG. 3 in which the locking device has been secured into position according to embodiments of the present invention.

FIG. 4 depicts the cover system/tab-lock system of FIG. 3 in which the locking device 300 has been secured into position according to embodiments of the present invention. Note that the locking device does not allow access to change the tab-locks but does not inhibit access to the functional element/interface openings (e.g., 315, 330, and 345). As shown in FIG. 4, due to the configuration set by the user prior to locking the locking device 300 into place, the openings 315 and 330 are not blocked, whereas opening 345 is blocked by the tab-lock/access cover.

In embodiments, the cover system may also include a visual indicator to make it easier to see that the opening is blocked. For example, the cover blocking the opening 345 may be colored red making it easy to see that the opening is blocked.

Figure 5:
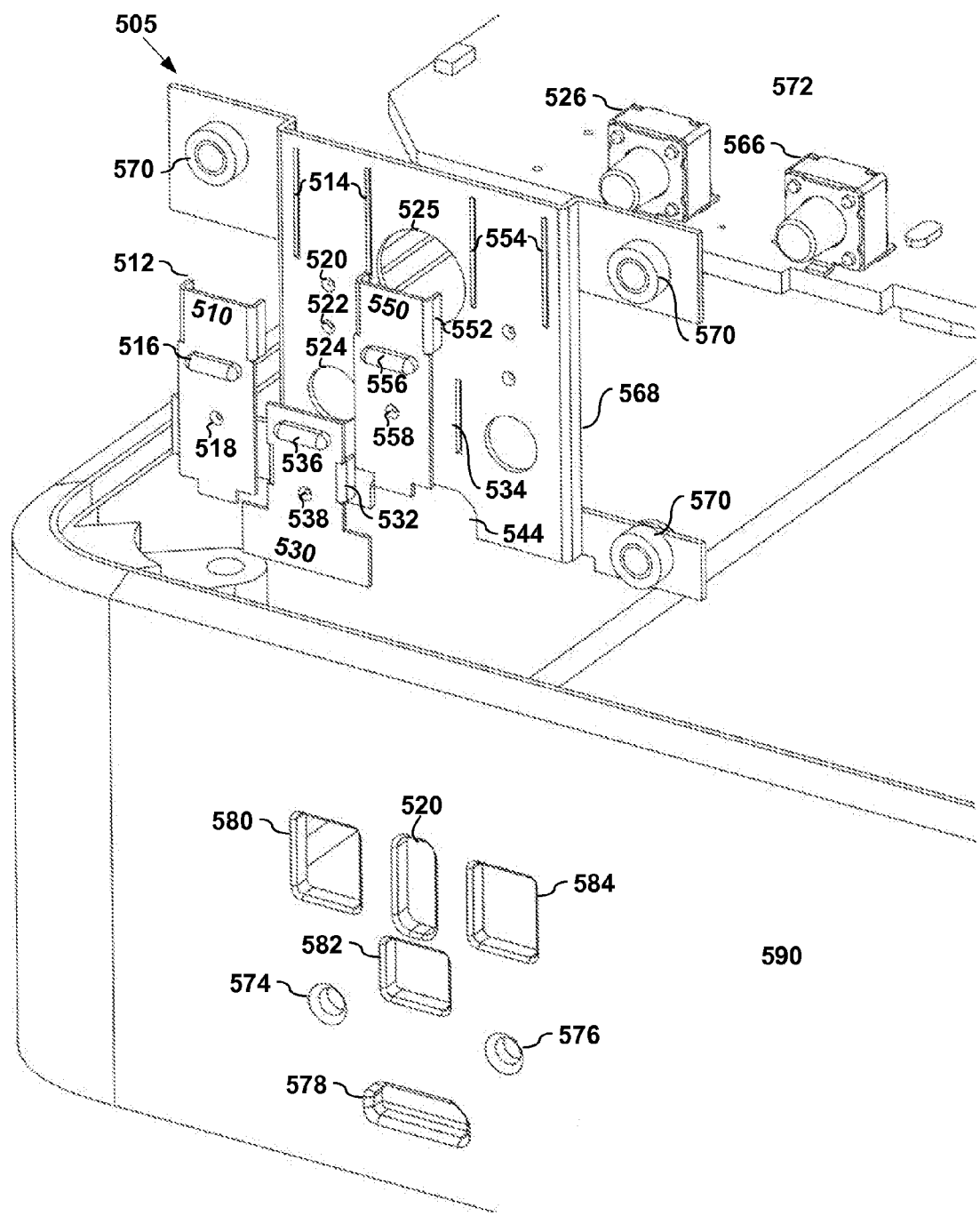
FIG. 5 depicts an exploded view of a cover system/tab-lock system and part of an enclosure of a device according to embodiments of the present invention.

Turning now to FIG. 5, depicted is an exploded view of an embodiment of a cover system/tab-lock system and part of an enclosure of a device according to embodiments of the present invention. The cover system/tab-lock system 505 comprises a tab-lock retainer 568 comprising one or more mounts 570 for fixedly attaching the system 505 to an enclosure 590 of a device. In embodiments, the assembly 505 may be integrated with the device.

In embodiments, the system 505 also includes one or more interface openings (e.g., 524 and 544) that correspond or align with one or more through-holes (e.g., 574, 576, and 578) in the enclosure 590 when the tab-lock system 505 is fixedly attached to the enclosure. This alignment of openings between the enclosure and the cover system 505 allows physical access to one or more interfaces/functional elements (e.g., functional elements 526 and 566 on circuit board 572) of the device. It shall be noted that alignment does not require strict alignment of the openings (e.g., alignment of their centers) but rather that they are aligned or correspond such that physical access can be gained to the functional elements/interfaces.

In embodiments, the system 505 also comprises an access cover/tab-lock (e.g., tab-locks 510, 530, and 550) that are capable of being moved relative to the through-holes (e.g., through-holes 574, 576, and 578) in the enclosure when the tab-lock system 505 is fixedly attached to the enclosure to obstruct or to not obstruct access to an interface element (e.g., functional elements 526 and 566) via a through-hole (e.g., through-holes 574 and 576, respectively). In the depicted embodiments, the covers or tab-locks slide, but it shall be noted that other configurations and other movements may be used, including but not limited to rotating and push buttons.

In embodiments, a tab-lock (e.g., tab-locks 510, 530, and 550) may comprise a finger-tab (e.g., finger-tabs 516, 536, and 556, respectively) attached to or integrated with of the tab-lock to enable a user to more easily move the tab-lock into either a secured position in which the tab-lock obstructs access to the interface or an unsecured position to not obstruct access to the interface. In embodiments, when the system 505 is secured to the device, the finger-tabs 516, 536, and 556 for the depicted tab-locks 510, 530, and 550 may be accessed via through-holes 580, 582 and 582 (respectively).

In embodiments, a tab-lock may also comprise an indicator that indicates to a user when the access cover is blocking the opening to the functional element. For example, part or all of the tab-lock may be vividly colored so that when it is exposed as it blocks the opening to the interface element, it is clearly visible to a user.

In embodiments, the system 505 includes a lock mounting feature comprising an opening 525 configured such that when a locking device is locked to the enclosure, the tab-lock is prohibited from its position being changed. In embodiments, this feature 525 aligns with a through-hole 520 in the enclosure to allow a locking device to be secured to the device. Consider, by way of illustration, the embodiment depicted in FIGS. 6 and 7.

Figure 6:
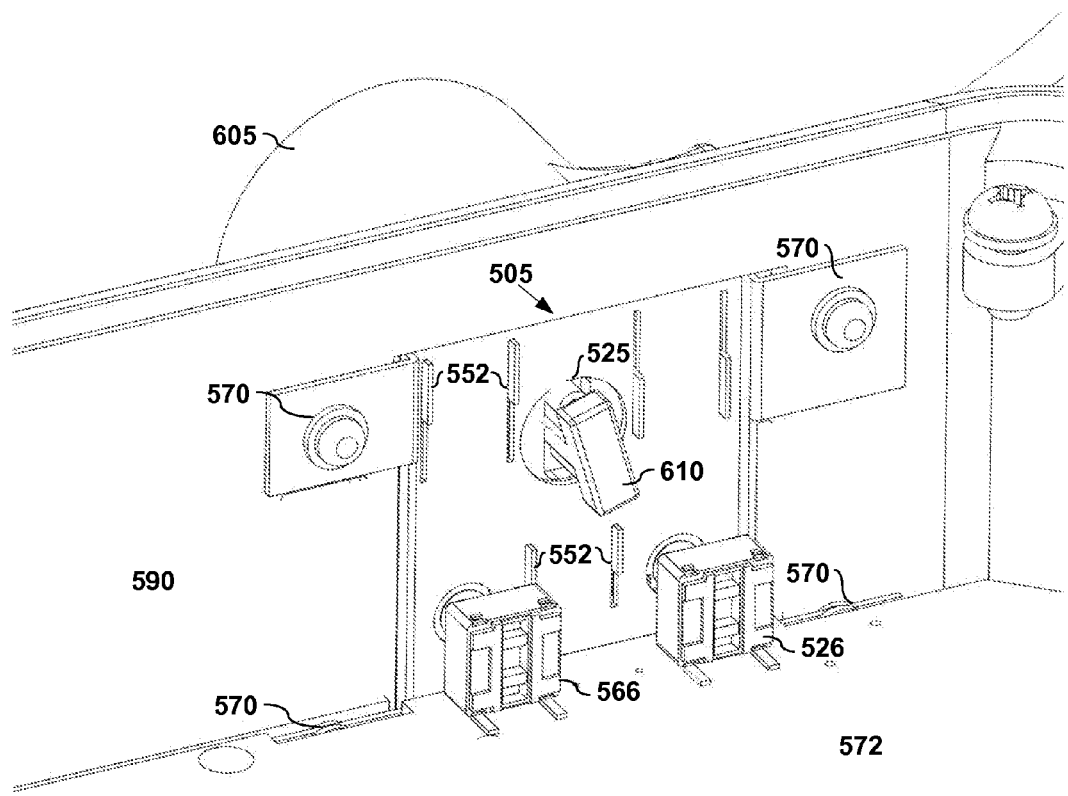
FIG. 6 depicts an interior view of a cover system/tab-lock system mounted into a device enclosure according to embodiments of the present invention.
Figure 7:
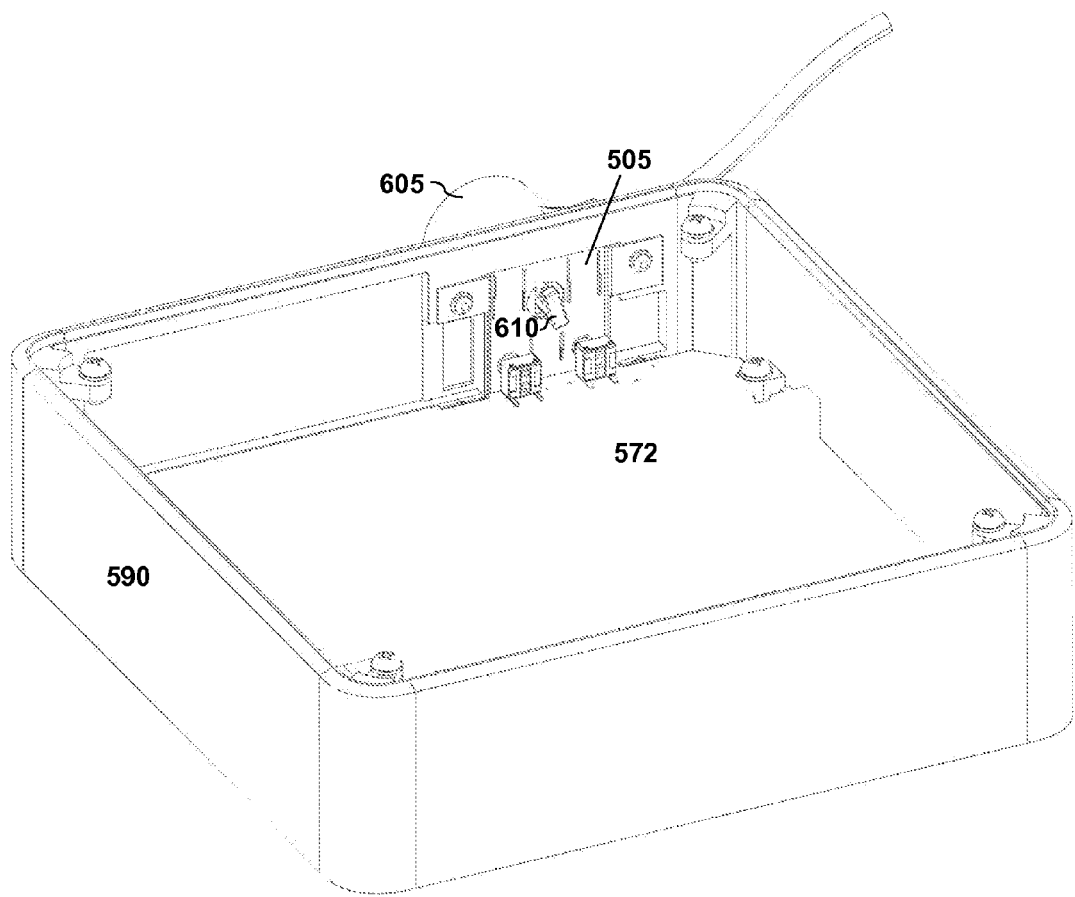
FIG. 7 depicts an alternate interior view of a cover system/tab-lock system mounted into a device enclosure according to embodiments of the present invention.
Figure 8:
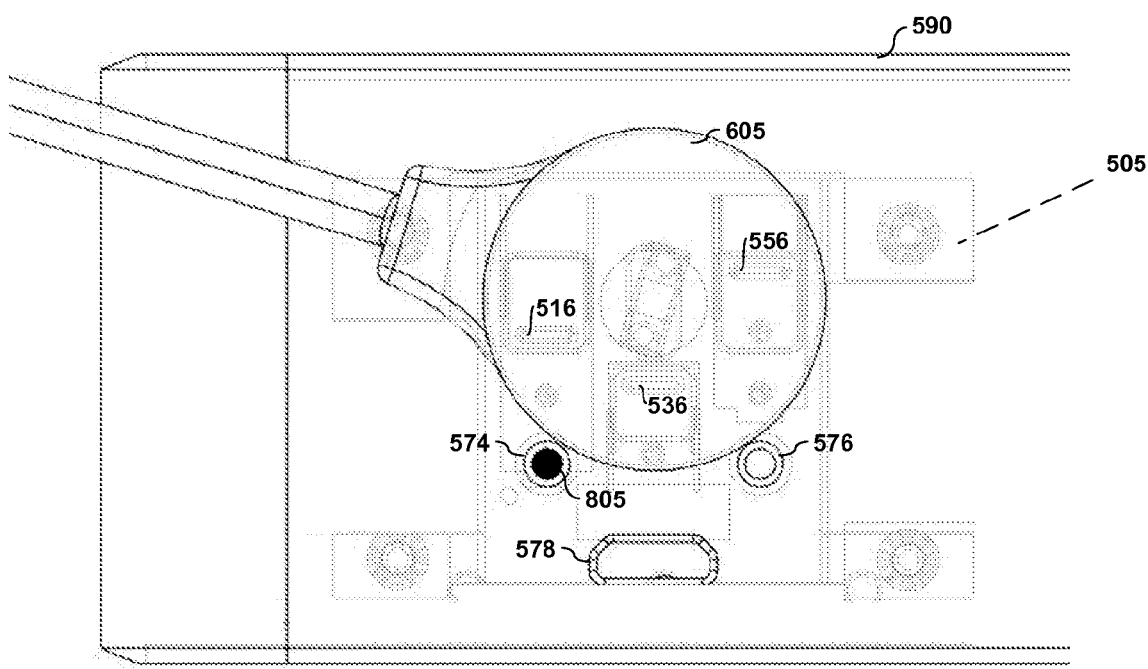
FIG. 8 depicts a partial front view with hidden lines of a device enclosure with a cover system/tab-lock system and a locking device according to embodiments of the present invention.

FIG. 6 depicts an interior view of a cover system/tab-lock system 505 mounted into a device enclosure 590 according to embodiments of the present invention. FIG. 7 depicts an alternate interior view of a cover system/tab-lock system 505 mounted into a device enclosure 590 according to embodiments of the present invention. As shown in FIGS. 6 and 7, a locking device 605, such as (by way of example and not limitation) a Kensington lock, when locked into place via lock tab 610 holds the lock 605 tightly to the enclosure 590. When locked into position, the lock 605 blocks access to the finger-tabs so that the tab-locks' positions cannot be changed. FIG. 8 depicts a partial front view with hidden lines of the device enclosure 590 with a cover system or tab-lock system 505 and a locking device 605 according to embodiments of the present invention. Note that the locking device 605 blocks access to the switches/finger-tabs 516, 536, and 556 so that they cannot be changed. Thus, access to the function element behind the opening 574 is blocked 805 and will remain blocked unless a user has the ability to unlock the locking device 605 and change that tab-lock's position.

Returning to FIG. 5, in embodiments, the tab-lock retainer 568 comprises one or more guides (e.g., guide slots 514, 534, and 554) to provide a limitation in movement and alignment between the tab-lock retainer and the tab-locks (e.g., tab-locks 510, 530, and 550, respectively). Thus, in embodiments, the tab-locks (e.g., tab-locks 510, 530, and 550) may include mating guide features (e.g., rails or tabs 512, 532, and 552, respectively). It shall be noted that other guiding mechanisms or configuration may be used.

In embodiments, the tab-lock retainer 568 comprises one or more tab-lock retainer features or locators (e.g., detents 520 and 522) and the corresponding tab-lock (e.g., tab-lock 510) comprises a mating tab-lock feature or locator (e.g., detent 518). The one or more tab-lock retainer locators may be in the form of a hole, groove, or other feature, and provide one or more set locations in the retainer so that the tab-lock locator feature may be set to a specific location to secure or to allow access to an internal component. Also, such features may provide tactile feedback to a user that the tab-lock is securely positioned in a selectable position.

Turning now to FIG. 9, depicted is a method for producing a device with securable access to a functional element in the device according to embodiments of the present invention. As depicted, the method comprises assembling (905) a device comprising one or more functional elements, and each functional element having an opening in an enclosure for the device to facilitate access to the functional element from outside the device. The method also comprises the step of including with the device a cover system that provides selectable access to the functional element. The included cover system may be integrated into the device or may be a subassembly that is attached to the device. In embodiments, the cover system may be any of the cover systems/tab-lock systems discussed above.

It shall be noted that the present patent document is directed to securing access to functional element/interface elements of electronic systems, including but not limited to computers, network management appliances, and/or information handling systems. One skilled in the art will recognize that the present invention may be embodied in different configurations, modified, and/or used for other applications. While the inventions have been described in conjunction with several specific embodiments, it is evident to those skilled in the art that many further alternatives, modifications, application, and variations will be apparent in light of the foregoing description. Thus, the inventions described herein are intended to embrace all such alternatives, modifications, applications and variations as may fall within the spirit and scope of the appended claims.

What is claimed is:

1. An apparatus for securing access to a functional element of a device, the apparatus comprising:
    a cover system that is securely attachable to or integral with a device comprising an enclosure with an opening to access the functional element of the device, the cover system comprising:
        an access cover that is moveably configurable to:
            a block position to block access to the functional element by being in a position in which at least a portion of the access cover blocks access to the functional element; and
            an open position to allow access to the functional element by being in a position that does not block access to the functional element;
        a switch for moving the access cover to the block position or to the open position; and a locking device opening for receiving a locking device that blocks the switch to prohibit the position of the access cover being changed when the lockable cover is locked on the device.

2. The apparatus of claim 1 wherein the cover system further comprising:
an indicator that indicates to a user when the access cover is blocking access to the functional element.

3. The apparatus of claim 1 wherein the cover system further comprises:
at least one feature to receive a mating feature on the access cover to define the block position, the open position, or both for the access cover; and
the access cover comprising the mating feature.

4. The apparatus of claim 1 wherein the locking device is a cable lock that covers the switch so that the switch cannot be accessed to change its position and also can assist in securing the device to a structure.

5. The apparatus of claim 1 wherein the device has a plurality of functional elements and the cover system comprises, for each functional element of a set of functional elements from the plurality of functional elements:
an access cover that is moveably configurable to:
a block position to block access to the functional element by being in a position in which at least a portion of the access cover blocks access to the functional element; and
an open position to allow access to the functional element by being in a position that does not block access to the functional element; and
a switch for moving the access cover to the block position or to the open position.

6. The apparatus of claim 5 wherein each access cover may be moved independently of another access cover.

7. The apparatus of claim 6 wherein, for each access cover of at least some of the access covers in the cover system, the cover system further comprises:
an indicator that indicates to a user when the access cover is blocking access to the functional element.

8. The apparatus of claim 5 wherein the cover system further comprises, for each of at least some of the access covers:
at least one feature to receive a mating feature on the access cover to define the block position, the open position, or both for the access cover; and
the access cover comprising the mating feature.

9. A tab-lock system for providing access to an interface of a device, the tab-lock system comprising:
a tab-lock retainer comprising one or more mounts for fixedly attaching the tab-lock system to the device and an interface opening that correlates with a through-hole in an enclosure of the device to facilitate physical access to the interface;
a tab-lock that is moveable relative to the through-hole in the enclosure when the tab-lock system is fixedly attached to the device, the tab-lock being moveable to a secured position to obstruct access to the interface via the through-hole and to an unsecured position to not obstruct access to the interface via the through-hole; and
a lock mounting feature comprising an opening configured to receive a locking device such that when the locking device is locked to the device, the tab-lock's position is prohibited from being changed.

10. The tab-lock system of claim 9 wherein the tab-lock further comprises:
a finger-tab attached to or integrated with of the tab-lock to assist a user in moving the tab-lock into either the secured position or the unsecured position.

11. The tab-lock system of claim 10 wherein:
the tab-lock retainer further comprises one or more guides to provide a limitation in movement between the tab-lock retainer and the tab-lock; and
the tab-lock further comprises one or more mating guide features for mating with the one or more guides in the tab-lock retainer.

12. The tab-lock system of claim 10 wherein:
the tab-lock retainer further comprises one or more tab-lock retainer locators to provide one or more set locations for the tab-lock; and
the tab-lock further comprises a tab-lock locator that is configured to mate with a tab-lock retainer locator.

13. The tab-lock system of claim 10 wherein the locking device is a lock that covers the finger-lock and can assist in securing the device to a structure.

14. The tab-lock system of claim 9 wherein the tab-lock system further comprising:
an indicator that indicates to a user when access to the interface is blocked by the tab-lock.

15. The tab-lock system of claim 9 wherein the device has a plurality of interfaces and corresponding through-holes and the tab-lock system comprises, for each interface of a set of interfaces from the plurality of interfaces:
a tab-lock that is moveable relative to a through-hole in the enclosure when the tab-lock system is fixedly attached to the device, the tab-lock being moveable to a secured position to obstruct access to the interface via the through-hole and to an unsecured position to not obstruct access to the interface via the through-hole; and
the tab-lock's position is prohibited from being changed when the locking device is locked to the device.

16. The tab-lock system of claim 15 wherein each tab-lock is independently moveable of another tab-lock.

17. A method for producing a device with securable access to a functional element in the device, the method comprising:
assembling a device comprising one or more functional elements, and each functional element having an opening in an enclosure for the device to facilitate access the functional element from outside the device;
including with the device a cover system that provides selectable access to the functional element, the cover system comprising:
an access cover that is moveably configurable to:
a block position to block access to the functional element by being in a position in which at least a portion of the access cover blocks access to the functional element; and
an open position to allow access to the functional element by being in a position that does not block access to the functional element; and
a locking device opening for receiving a locking device that prohibits the position of the access cover being changed when the lockable cover is locked on the device.

18. The method of claim 17 wherein the cover system further comprising:
an indicator that indicates to a user when the access cover is blocking access to the functional element.

19. The method of claim 17 wherein the cover system further comprises:
   at least one feature to receive a mating feature on the access cover to provide one or more set locations for the access cover; and
   the access cover comprising the mating feature.

20. The method of claim 17 wherein the cover system further comprises a switch for moving the access cover to the block position or to the open position and wherein the locking device is a cable lock that covers the switch so that the switch cannot be accessed to change its position.

* * * * *